United States Patent [19]
Lee

[11] Patent Number: 5,650,965
[45] Date of Patent: *Jul. 22, 1997

[54] METHOD OF NARROWING FLASH MEMORY DEVICE THRESHOLD VOLTAGE DISTRIBUTION

[75] Inventor: Roger R. Lee, Bosie, Id.

[73] Assignee: Micron Technology, Inc., Boise, Id.

[*] Notice: The term of this patent shall not extend beyond the expiration date of Pat. No. 5,633,823.

[21] Appl. No.: 584,601

[22] Filed: Jan. 11, 1996

Related U.S. Application Data

[63] Continuation-in-part of Ser. No. 348,649, Dec. 1, 1994, which is a continuation-in-part of Ser. No. 152,809, Nov. 15, 1993, Pat. No. 5,424,993.

[51] Int. Cl.$^6$ .................................................. G11C 7/00
[52] U.S. Cl. .............................. 365/185.29; 365/185.3; 365/218
[58] Field of Search ........................... 365/185.29, 185.3, 365/218

[56] References Cited

U.S. PATENT DOCUMENTS

| | | | |
|---|---|---|---|
| 4,279,024 | 7/1981 | Schrenk | 365/203 |
| 4,805,151 | 2/1989 | Terada et al. | 365/218 |
| 5,163,021 | 11/1992 | Mehrotra et al. | 365/185 |
| 5,233,562 | 8/1993 | Ong et al. | 365/218 |
| 5,237,535 | 8/1993 | Miekle et al. | 365/218 |
| 5,268,870 | 12/1993 | Harari | 365/218 |
| 5,272,669 | 12/1993 | Samachisa et al. | 365/185 |
| 5,335,198 | 8/1994 | Van Buskirk et al. | 365/185 |
| 5,424,993 | 6/1995 | Lee et al. | 365/218 |

*Primary Examiner*—Son T. Dinh

[57] ABSTRACT

A method of erasing memory cells in a sector of a flash programmable memory device, the sector having a plurality of word lines and a plurality of memory cells along each of the word lines, each of the cells in the sector having a source region common to all cells in the sector, the method comprising a first step of erasing the memory cells in the sector simultaneously, then reading a first cell along a first word line to determine if the first cell is under-erased. Responsive to the first cell being erased, a second cell along the first word line is read to determine if the second cell is under-erased. Responsive to the second cell being under-erased, a negative first voltage is applied to the first word line, a positive second voltage is applied to the common source of the cells in the sector, and a positive third voltage is applied to the plurality of word lines except the first word line.

22 Claims, 2 Drawing Sheets

|  | Control Gate | Source | Drain |
|---|---|---|---|
| Program | 12 V | 0 V | 6 V |
| Erase | GND | 12 V | FLOAT |
| Read | 5 V | GND | 1 V - 2 V |

FIG. 1

METHOD OF NARROWING FLASH MEMORY DEVICE THRESHOLD VOLTAGE DISTRIBUTION

This is a continuation-in-part of application Ser. No. 08/348,649 filed Dec. 1, 1994, which was a continuation-in-part of application Ser. No. 08/152,809, filed Nov. 15, 1993, issued Jun. 13, 1995 as U.S. Pat. No. 5,424,993.

FIELD OF THE INVENTION

The invention relates to semiconductor memory devices, and more specifically to a method for erasing a sector of a flash memory device.

BACKGROUND OF THE INVENTION

In recent years flash memory has emerged as an important category of memory device, as flash devices combine high density with electrical erasability. Flash memories comprise a plurality of one-transistor flash electrically-erasable programmable read-only memory (EEPROM) cells formed on and within a semiconductor substrate. Each cell comprises a P-type conductivity substrate, an N-type conductivity source region formed within the substrate, and an N-type conductivity drain region also formed within the substrate. A floating gate is separated from the substrate by a dielectric layer. A second dielectric layer separates a control gate from the floating gate. A P-type channel region within the substrate is interposed between the source and drain. The control gate of the cell is formed from a word line, and a plurality of cells are along each word line such that one word line controls a plurality of cells. A digit line interconnects the drain regions of a plurality of cells.

Various voltages are associated with a flash cell, as shown in FIG. 1. To program a flash cell the drain region and the control gate are raised to predetermined potentials above the potential applied to the source region. For example 12 volts is applied to the control gate, 0.0 volts is applied to the source, and 6.0 volts is applied to the drain. These voltages produce "hot electrons" which are accelerated from the substrate across the dielectric layer to the floating gate. This hot electron injection results in an increase of the threshold voltage (the voltage which must be applied between the source, drain, and control gate for the cell to conduct) by approximately two to four volts.

To erase a flash cell a high positive potential, for example 12 volts, is applied to the source region, the control gate is grounded, and the drain is allowed to float. These voltages are applied for a timed period, and the longer the period the more the cell becomes erased. A strong electric field develops between the floating gate and the source region, and negative charge is extracted from the floating gate to the source region, for example by Fowler-Nordheim tunneling. If an unprogrammed flash EEPROM cell in an array of such cells is repeatedly erased under these conditions, the floating gate will eventually acquire a more positive potential. Consequently, even with the control gate being grounded the cell will always be turned on. This causes column leakage current thereby preventing the proper reading of any other cell in the column of the array containing this cell as well as making programming of the other cells on the same column increasingly more difficult. This condition, referred to as "over-erase," is disadvantageous since the data programming characteristics of the memory cell is deteriorated so as to cause endurance failures.

To determine if a cell is programmed, the magnitude of the read current is measured, for example by grounding the source, applying about 5.0 volts to the control gate, and applying between 1.0 and 2.0 volts to the drain. Under these conditions, an unprogrammed cell will conduct at a current level of about 50 to 100 microamps. The programmed cell will have considerably less current flowing.

To change the content of a flash memory device all cells are programmed and then erased and then selected cells are programmed. By first programming all of the cells and then erasing all cells, over-erasure of any unprogrammed cells is reduced. An over-erase condition must be avoided to prevent a cell from functioning as a depletion transistor in the read mode of operation. During a read mode of an over-erased memory cell an entire column of a sector can be disabled.

An advantage of a flash memory device is that an entire sector of cells can be erased simultaneously as the sources for each cell within the sector are tied together. Some cells, however, erase more quickly than others resulting from manufacturing variations from cell to cell such as the dielectric thickness between the substrate and the floating gate. The flash erase cycle must therefore be optimized for the "average" cell of the entire sector. Some cells will be slightly over-erased while some remain slightly under-erased, and thus a variation in the threshold voltage of the cells in the sector results. A method of erasing cells within a sector which provides for a more uniform threshold voltage distribution would be desirable.

SUMMARY OF THE INVENTION

A method of erasing memory cells in a sector of a memory device, the sector having a plurality of word lines and a plurality of memory cells along each of the word lines, comprises a first step of erasing the memory cells in the sector simultaneously. Next, subsequent to the step of erasing, a first cell along a first word line is read to determine if the first cell is under-erased. If the first cell is erased, a second cell along the first word line is read to determine if it is under-erased. Responsive to the second cell being under-erased, only the plurality of cells along the first word line are further erased.

Objects and advantages will become apparent to those skilled in the art from the following detailed description read in conjunction with the appended claims and the drawings attached hereto.

BRIEF DESCRIPTION OF THE DRAWINGS

FIG. 1 is a table showing the voltages associated with a flash memory device.

DETAILED DESCRIPTION OF THE INVENTION

Figure 2:
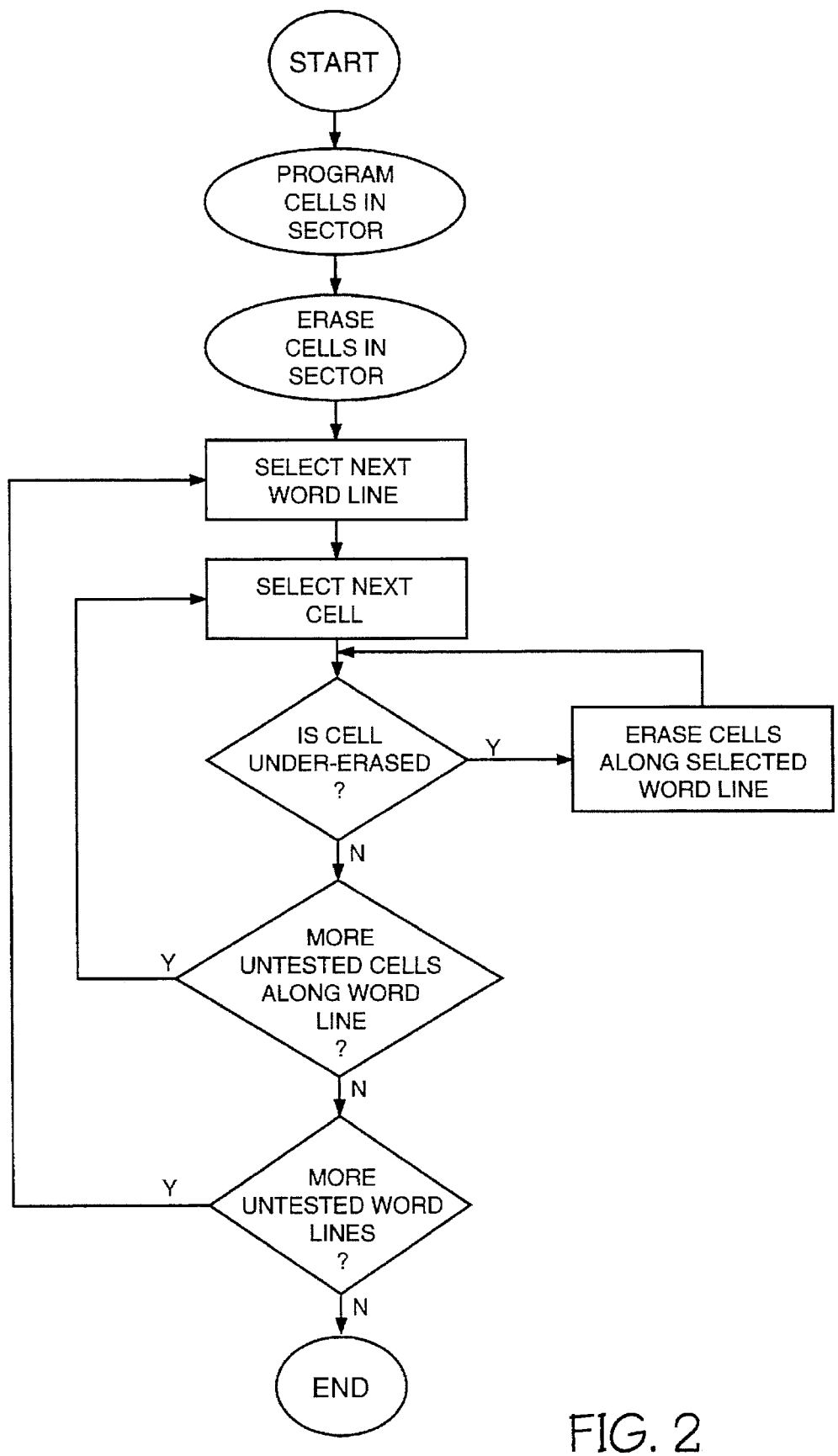
FIG. 2 is a flow chart describing one embodiment of the inventive method.

A memory device such as a flash memory device typically comprises a sector having a plurality of word lines and a plurality of memory cells along each word line. One embodiment of the inventive method for erasing memory cells in a sector of a memory device, as described in FIG. 2, comprises programming the memory cells in the sector, then erasing the memory cells in the sector simultaneously. Subsequently, a first word line is selected, and a first cell along the first word line is selected and read to determine if the first cell is under-erased.

It should be noted that for purposes of this disclosure, an under-erased cell is a cell which functions as a programmed cell when it is expected to function as an unprogrammed cell or as an erased cell. For example, using the cell arrangement described in the background section, if a cell is properly erased it should conduct (i.e. "turn on," "trip," or conduct across its channel between its source and drain) when the read voltages are applied. If a cell which is erased does not conduct when the read voltages are applied, it is considered to be under-erased.

With this embodiment of the invention, if the first cell is read and is determined to be under-erased, the first cell and the other cells along the first word line in the sector are further erased. While the cells along the first word line are further erased the remaining cells in the sector along the other word lines are maintained (not further erased). The first cell is again read to determine if the erasure has been successful. If the first cell remains under-erased, it is further erased. This "erase-then-read" process continues until the cell is determined to be erased. Once the first cell is determined to be adequately erased, the second cell along the word line is similarly read and erased if required. Each cell along the first word line is similarly tested in turn. When all the cells along the first word line have been repaired and/or found to be adequately erased the cells along the second word line are read and repaired if necessary, then each cell, in turn, along the third and then the remaining word lines.

If the first cell is not under-erased no further erasure (i.e. repair) of the first cell is necessary, and the second cell along the first word line is read and repaired if necessary. After all cells along the first word line have been tested and repaired if necessary, the cells along the second and then the remaining word lines are tested and repaired if necessary.

It can be seen that as the test progresses along the word line each cell has a higher probability of being properly erased, as the cells along the word line have been further erased if any previous cells along its word line have been further erased. Erasing all cells along one word line is required because the sources are tied together.

The method of erasing can comprise various voltages on the word lines and the source lines, while the digit lines are allowed to float. A negative voltage can be applied to the first word line and, simultaneously, a voltage greater than or equal to 0.0 volts (a nonnegative voltage) is applied to the plurality of word lines except the first word line to maintain (not further erase) cells along those word lines. For example, about −10 volts can be applied to the first word line (the one having a cell therealong to be erased) while about +5 volts is applied to the plurality of word lines in the sector except the first word line. Simultaneously applying +5 volts to the source region of the cells in the sector would allow the cells along the first word line to be erased while the cells along the other word lines are maintained. These voltages can be applied for a timed interval, for example from about 0.1 millisecond to about 1.0 second, which may vary depending on the voltages applied to the word lines and the source regions.

By further erasing only those cells along the word line where an under-erased cell is detected, the cells along the remaining word lines are not over-erased while the under-erased cell is being further erased. It can be seen that the probability of over-erasing a cell in the sector is decreased over repair schemes which further erase every cell in the sector if one under-erased cell is to be repaired.

In an alternate embodiment, a cell which is determined to be under-erased is repaired but is not re-read to determine if it has been repaired. This embodiment would be possible when it is known that specific voltages applied to the word line and to the source of a cell for a time during a further erasure of the cell is adequate to ensure it functions as an erased cell.

The inventive memory device could conceivably be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment. Further, the inventive method can be implemented on-chip, or as an external circuit.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, various voltages can be applied to the word lines and the sources while maintaining the spirit of the invention. It is therefore contemplated that the appended claims will cover any such modifications or embodiments as fall within the true scope of the invention.

What is claimed is:

1. A method of erasing memory cells in a sector of a memory device, said sector having a plurality of word lines and a plurality of memory cells along each of said word lines, said method comprising the following steps:
   a) reading a first cell along a first word line to determine if said first cell is under-erased;
   b) responsive to said first cell being erased, reading a second cell along said first word line to determine if said second cell is under-erased;
   c) responsive to said second cell being under-erased, further erasing only said plurality of cells along said first word line.

2. The method of claim 1 further comprising the step of rereading said second cell to determine if said second cell remains under-erased subsequent to said step of further erasing.

3. The method of claim 2 further comprising reading a third cell to determine if said third cell is under-erased subsequent to said step of rereading said second cell.

4. The method of claim 1 further comprising the step of applying a negative voltage to said first word line and, simultaneously, applying a voltage greater than or equal to 0.0 volts to said plurality of word lines except said first word line during said step of further erasing.

5. The method of claim 1 further comprising the step of applying about −10V to said first word line, applying about +5V to a source of said first cell, and applying about +5V to said plurality of word lines except said first word line during said step of further erasing.

6. The method of claim 5 wherein said voltages are applied for between about 0.1 millisecond to about 1.0 second.

7. The method of claim 1 further comprising erasing said memory cells in said sector simultaneously prior to said step of reading said first cell.

8. The method of claim 7 further comprising the step of programming said memory cells in said sector prior to said step of erasing said memory cells.

9. A method of erasing memory cells in a sector of a memory device, said memory cells each having a source, a drain, and a control gate, said sector having a plurality of word lines and a plurality of memory cells along each of said word lines, said method comprising the following steps:
   a) applying a read voltage to a source, a drain, and a control gate of a first cell along a first word line to determine if said first cell conducts;

b) responsive to said first cell conducting, reading a second cell along said first word line to determine if said second cell conducts;

c) responsive to said second cell not conducting, further erasing only said plurality of cells along said first word line.

10. The method of claim 9 further comprising the step of rereading said second cell to determine if said second cell conducts subsequent to said step of further erasing.

11. The method of claim 10 further comprising reading a third cell to determine if said third cell conducts subsequent to said step of rereading said second cell.

12. The method of claim 9 further comprising the step of applying a negative voltage to said first word line and, simultaneously, applying a voltage greater than or equal to 0.0 volts to said plurality of word lines except said first word line during said step of further erasing.

13. The method of claim 9 further comprising the step of applying about −10V to said first word line, applying about +5V to a source of said first cell, and applying about +5V to said plurality of word lines except said first word line during said step of further erasing.

14. The method of claim 13 wherein said voltages are applied for between about 0.1 millisecond to about 1.0 second.

15. The method of claim 9 further comprising erasing said memory cells in said sector simultaneously prior to said step of reading said first cell.

16. The method of claim 15 further comprising the step of programming said memory cells in said sector prior to said step of erasing said memory cells.

17. A method of erasing memory cells in a sector of a flash programmable memory device, said sector having a plurality of word lines and a plurality of memory cells along each of said word lines, each of said cells in said sector having a source region common to all cells in said sector, said method comprising the following steps:

a) erasing said memory cells in said sector simultaneously;

b) subsequent to said step of erasing, reading a first cell along a first word line to determine if said first cell is under-erased;

c) responsive to said first cell being erased, reading a second cell along said first word line to determine if said second cell is under-erased;

d) responsive to said second cell being under-erased, applying a negative first voltage to said first word line, applying a positive second voltage to said common source of said cells in said sector, and applying a positive third voltage to said plurality of word lines except said first word line.

18. The method of claim 17 wherein said second voltage is about 5.0 volts.

19. The method of claim 18 wherein said third voltage is about 5.0 volts.

20. The method of claim 19 wherein said first voltage is about −10.0 volts.

21. The method of claim 20 further comprising the step of rereading said second cell to determine if said second cell remains under-erased subsequent to said step of further erasing.

22. The method of claim 21 further comprising reading a third cell to determine if said third cell is under-erased subsequent to said step of rereading said second cell.

* * * * *